(12) United States Patent
Kitchens

(10) Patent No.: US 7,986,154 B2
(45) Date of Patent: Jul. 26, 2011

(54) CAPACITIVE SENSING SLIDE DETECTION

(75) Inventor: Stephen Anthony Kitchens, Durham, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 520 days.

(21) Appl. No.: 12/114,361

(22) Filed: May 2, 2008

(65) Prior Publication Data

US 2009/0273355 A1    Nov. 5, 2009

(51) Int. Cl.
*G01R 27/26* (2006.01)
*H04M 1/00* (2006.01)
(52) U.S. Cl. .................... 324/679; 455/575.4
(58) Field of Classification Search ............ 324/679
See application file for complete search history.

(56) References Cited

U.S. PATENT DOCUMENTS

| | | | | |
|---|---|---|---|---|
| 4,263,782 | A * | 4/1981 | Matsumoto et al. | 60/276 |
| 5,453,698 | A * | 9/1995 | Williams et al. | 324/678 |
| 6,522,115 | B1 * | 2/2003 | Greitschus | 323/288 |
| 6,876,260 | B2 * | 4/2005 | Visocchi | 330/308 |
| 7,705,611 | B2 * | 4/2010 | Ogata et al. | 324/661 |
| 2004/0190217 | A1 * | 9/2004 | Stokes | 361/277 |
| 2006/0192565 | A1 * | 8/2006 | Yasuda et al. | 324/458 |
| 2007/0008165 | A1 | 1/2007 | Jeon | |
| 2007/0287504 | A1 | 12/2007 | Lim et al. | |

FOREIGN PATENT DOCUMENTS

| DE | 34 28 699 A1 | 2/1986 |
|---|---|---|
| DE | 198 06 508 A1 | 8/1999 |

OTHER PUBLICATIONS

Notification of Transmittal of the International Search Report and the Written Opinion of the International Searching Authority, or the Declaration, corresponding to PCT/US2008/088416, dated Apr. 1, 2009, 14 pages.

* cited by examiner

*Primary Examiner* — Jeff Natalini
(74) *Attorney, Agent, or Firm* — R. Brian Drozd; Moore & Van Allen PLLC

(57) ABSTRACT

A circuit includes a first capacitor having first and second capacitive sensing strips positioned on first and second sliding portions of the slider type mobile device. In the closed position, the first and second capacitive sensing strips overlap one another and in an open position the first and second capacitive sensing strips have no overlap with one another. A voltage divider having a voltage $V_{IN(+)}$ comprised of a first resistor network is coupled with the first capacitor. A voltage comparator having two inputs $V_{IN(+)}$ and $V_{IN(-)}$ is used to determine a high or low state. A second resistive network is used to set $V_{IN(-)}$. The voltage comparator will return a digital high condition indicative of the slider being in the open position when $V_{IN(+)}$ is greater than $V_{IN(-)}$ and a digital low condition indicative of the slider being in the closed position when $V_{IN(+)}$ is less than $V_{IN(-)}$.

5 Claims, 5 Drawing Sheets

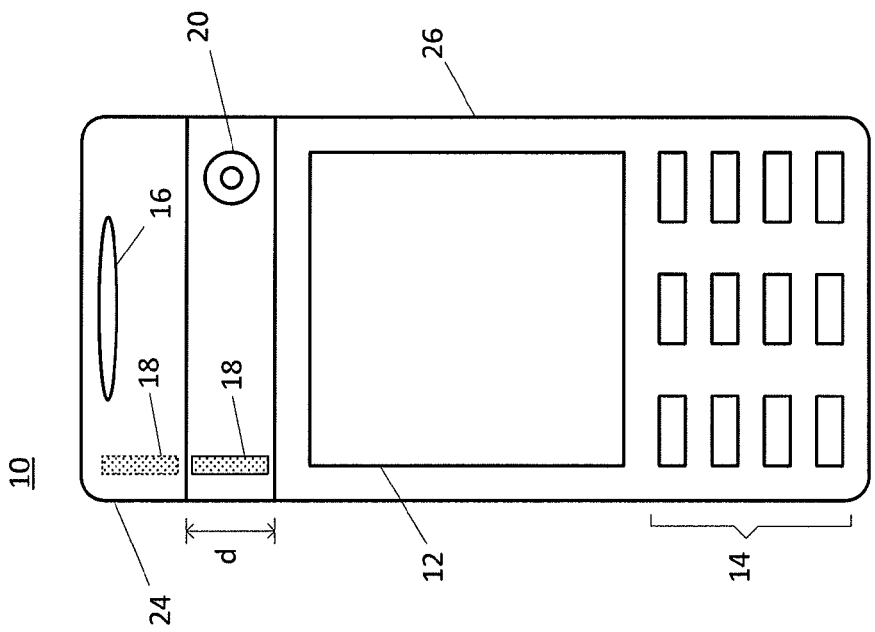
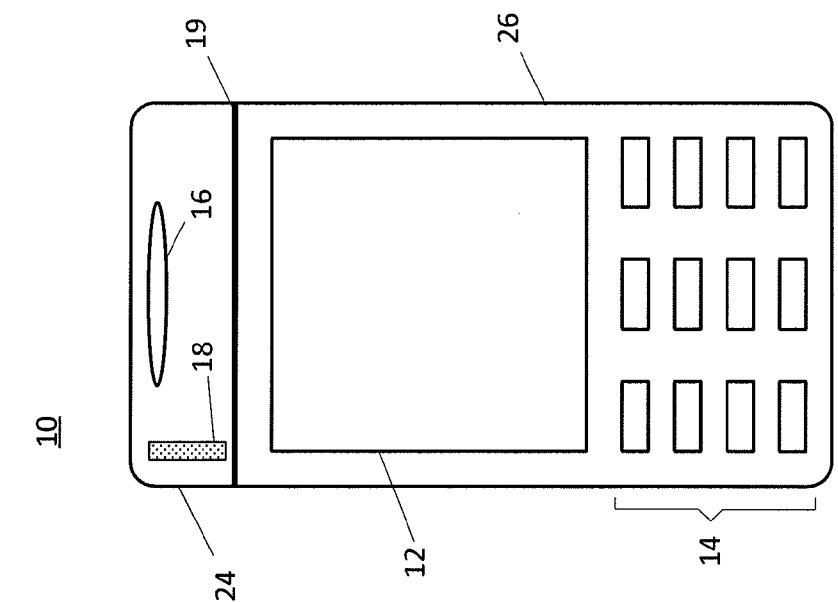

US 7,986,154 B2

CAPACITIVE SENSING SLIDE DETECTION

SUMMARY

In a first embodiment there is disclosed a circuit that determines whether a slider type mobile device is in an open position or a closed position. The circuit includes a first capacitor having first and second capacitive sensing strips positioned on first and second sliding portions of the slider type mobile device. In the closed position, the first and second capacitive sensing strips overlap one another and in an open position the first and second capacitive sensing strips have no overlap with one another. A voltage divider having a voltage $V_{IN(+)}$ comprised of a first resistor network is coupled with the first capacitor. A voltage comparator having two inputs $V_{IN(+)}$ and $V_{IN(-)}$ is used to determine a high or low state. A second resistive network is used to set $V_{IN(-)}$.

The voltage comparator will return a digital high condition indicative of the slider being in the open position when $V_{IN(+)}$ is greater than $V_{IN(-)}$ and a digital low condition indicative of the slider being in the closed position when $V_{IN(+)}$ is less than $V_{IN(-)}$. A second capacitor C2 coupled with the second resistor network can be used to keep $V_{IN(-)}$ stable.

In a second embodiment there is disclosed a circuit that determines the extent that a slider type mobile device is in an open position or a closed position. The circuit includes a first capacitor having first and second capacitive sensing strips positioned on first and second sliding portions of the slider type mobile device such that in a closed position the first and second capacitive sensing strips overlap one another and in an open position the first and second capacitive sensing strips have no overlap with one another. A voltage divider having a voltage $V_{OUT}$ comprised of a first resistor network is coupled with the first capacitor. $V_{OUT}$ linearly varies based on the change in capacitance due to a change in overlap between the first and second capacitive sensing strips that comprise C1 when they are slidably moved away from one another. An analog-to-digital converter (ADC) receives input from the voltage divider and reads the voltage level $V_{OUT}$. The ADC can determine a sliding distance based on the current voltage level $V_{OUT}$. A second capacitor C2 coupled with a second resistor network can be used to keep a stable reference voltage at the input of the analog-to-digital converter (ADC).

In a third embodiment there is disclosed a method that utilizes the circuit of the first embodiment to determine whether a slider type mobile device is in an open position or a closed position. The method includes setting $V_{IN(-)}$ to a threshold level and measuring or reading $V_{IN(+)}$. $V_{IN(+)}$ is compared to $V_{IN(-)}$ and it is determined that the slider is in an open position if $V_{IN(+)}$ is greater than $V_{IN(-)}$ and that the slider is in a closed position if $V_{IN(+)}$ is less than $V_{IN(-)}$.

The slider type mobile device can use this information as an input to perform an action based on a change in the slider position.

In a fourth embodiment there is disclosed a method that utilizes the circuit of the second embodiment to determine the extent that a slider type mobile device is in an open position or a closed position. The method includes establishing baseline $V_{OUT}$ levels for the slider type mobile device in the open position and the closed position. The difference between the baseline $V_{OUT}$ levels for the slider type mobile device in the open position and the closed position is then calculated. A linear scale relating the distance between open and closed slider positions and the $V_{OUT}$ levels for the open and closed slider positions is created. The current $V_{OUT}$ level is read and the extent that the slider is open based on the current $V_{OUT}$ level can be determined.

The slider type mobile device can use this information as an input to perform an action based on a change in the slider position.

BRIEF DESCRIPTION OF THE DRAWINGS

FIG. 1 illustrates a front view of a slider type mobile device in an closed position.

FIG. 2 illustrates a front view of a slider type mobile device in an open position.

DETAILED DESCRIPTION OF THE INVENTION

Figure 3:
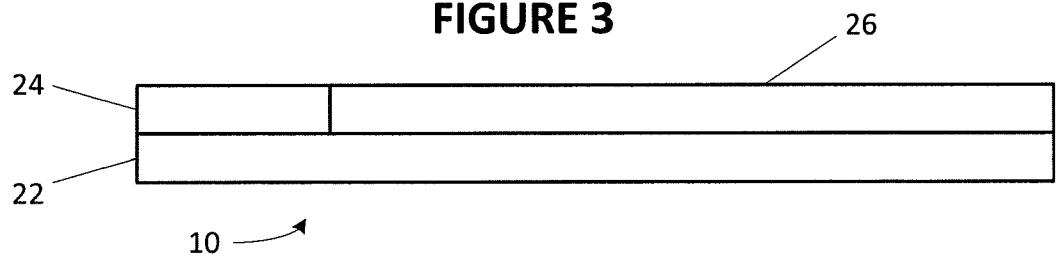
FIG. 3 illustrates a side view of a slider type mobile device in an closed position.

Portable mobile devices such as mobile phones come in a variety of shapes, sizes, and form factors. One popular form factor is termed a slider. A slider device generally comprises a parallel plate-like structure in which the two plates substantially if not completely cover one another when in a closed position. The plates are typically movable relative to each other such that some portion of each plate can be exposed. When the plates are exposed they are said to be in an open position.

There are many reasons for using a slider form factor. One reason is to protect certain components of the device when not in use. For instance, a keypad or a display can be contained on an inner surface of a slider device such that it is not exposed when the device is in the closed position.

There can also be more than one direction of movement that can be achieved in a slider device. A slider device can be made to move in a 'x' direction only, a 'y' direction only, or an 'x' and 'y' direction. Moreover, the slider action can be rotational about a pivot point.

Regardless of the direction of movement of a slider, there exists a need to determine when the slider device is in the closed position and when it is in an open position. This information can be used to execute certain functions of the device. For instance, if a slider device exposes a keypad when in the open position, it would be useful to know when the device changes from closed to open so that the keypad can be activated upon opening and de-activated upon closing. Similarly, a slider that exposes a display will only want to provide power to the display when it is exposed.

Currently, magnetic sensors are the preferred method of slider detection. When magnets on either plate are separated, the magnetic field is altered. Magnets, however, can be rather large relative to the devices and can be difficult to accurately detect when a slider is moved a relatively short distance. Moreover, magnet systems also tie up valuable general purpose input/output (GPIO) pulse and polling resources within the mobile device.

The embodiments of the invention do not use a magnetic sensor system to determine whether the slider device is in an open or closed position. Rather, the embodiments of the invention utilize a pair of spaced apart parallel capacitive sensing plates in conjunction with circuitry to determine whether the slider device is in an open or closed position. The capacitive sensing plates have a much smaller and thinner profile than magnetic sensors and do not tax the GPIO resources as much as the magnetic sensor systems.

FIG. 1 illustrates a front view of a slider type mobile device in a closed position. This illustration is an example of a mobile phone device 10. Also shown is a display 12, a keypad 14 and a speaker 16. Line 19 is indicative of a seam wherein the portion above line 19 is capable of sliding upward to expose an additional portion of the mobile phone device 10. The seam or line 19 separates the top plate of the mobile phone device 10 into an upper top plate 24 and a lower top plate 26. The dotted outline shaded portion represents a capacitive sensing metallic strip 18. In practice, there are two of these capacitive sensing metallic strips 18 separated by an air gap. One capacitive sensing metallic strip 18 is adhered to the underside of upper top plate 24 while the other capacitive sensing metallic strip 18 is adhered to the topside of the bottom plate. When in the closed position, as is shown in FIG. 1, the capacitive sensing metallic strips 18 completely overlap one another creating a capacitance value.

FIG. 2 illustrates a front view of a slider type mobile device in an open position. In this illustration, the mobile phone device 10 is open in that upper top plate 24 has been separated from lower top plate 26 by a distance 'd' to expose a camera lens 20 and the second capacitive sensing metallic strip 18. Thus, in this example, the slider function exists to hide and expose a camera lens 20. When in the open position, the mobile phone device 10 can prepare and/or launch applications associated with the camera functions of the device.

Figure 4:
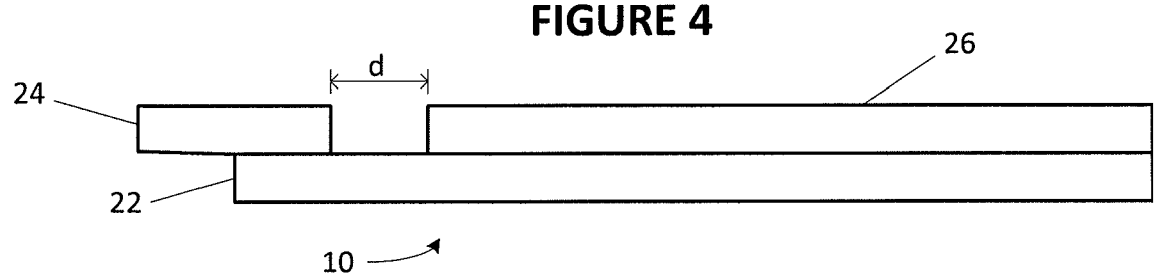
FIG. 4 illustrates a side view of a slider type mobile device in an open position.

FIG. 3 illustrates a side view of a slider type mobile device 10 in a closed position. In this illustration, the two top plates 24, 26 and the bottom plate 22 of the mobile phone device 10 are visible in the closed position. FIG. 4 illustrates a side view of a slider type mobile device 10 in an open position wherein the upper top plate 24 has been slidably moved away from the lower top plate 26 a distance 'd'.

FIGS. 1-4 illustrate a specific mobile phone device slider form factor. The use of the capacitive sensing metallic strips 18, however, is independent of the slider form factor. Those of ordinary skill in the art readily recognize that the capacitive sensing metallic strips 18 may be used for other slider form factors. Moreover, the detection of open/close can be used as an input signal to a variety of mobile device applications not just launching a camera application as described above.

Figure 5:
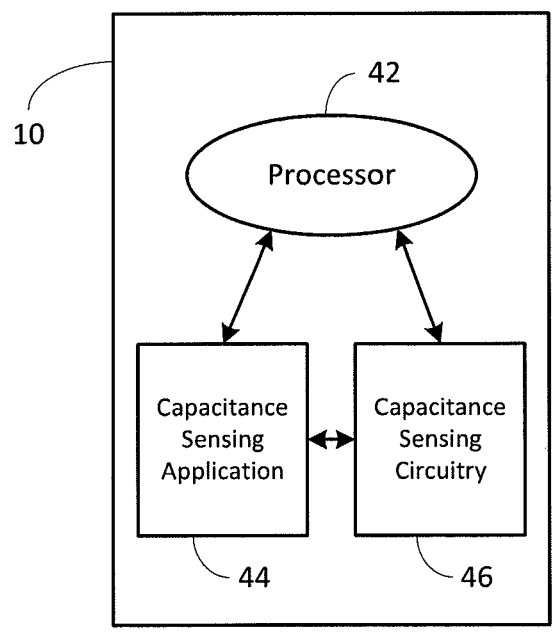
FIG. 5 is a block diagram of a slider type mobile device showing components that can be used to detect the position of the slider type mobile device.

FIG. 5 is a block diagram of a slider type mobile device 10 showing components that can be used to detect the position of the slider type mobile device 10. A processor 42 is coupled with a capacitance sensing software application 44 and capacitance sensing circuitry 46. The capacitance sensing circuitry 46 includes the capacitive sensing metallic strips 18. The capacitance sensing software application 44 is utilized to respond to the open or closing of the slider feature. The opening and the closing of the slider feature can be considered input to a process. The process can use the input as a trigger to launch one or more other features within the mobile device 10.

Figure 6:
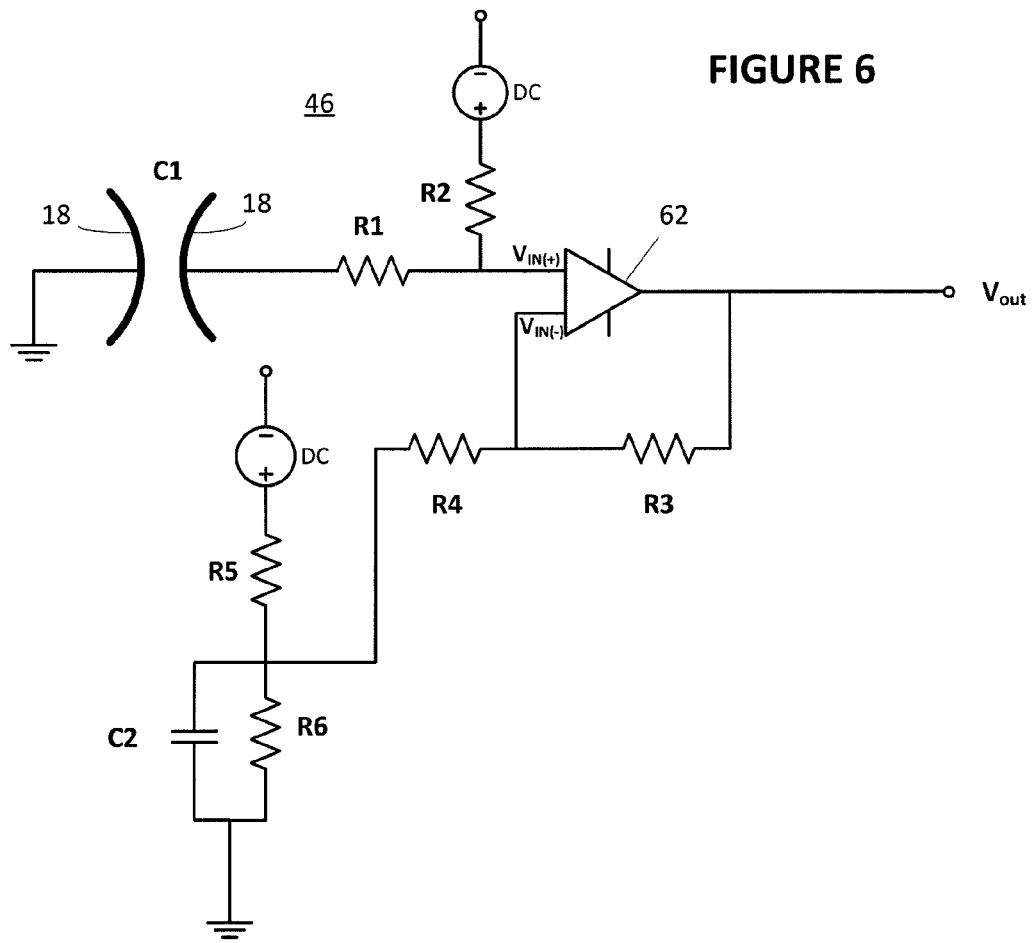
FIG. 6 illustrates a digital output circuit to aid in detecting the position of the slider type mobile device.

FIG. 6 illustrates a digital output circuit to aid in detecting the position of the slider type mobile device. Digital output implies a binary state of operation, either the slider is open or closed. The metallic strip capacitive sensing plates 18 comprise capacitor C1 and can be found on the top 24 and bottom 22 plates of the mobile phone device 10. When a capacitive load is present at capacitor C1, current will flow across resistor R1, creating a voltage divider between resistor R1 and resistor R2. This voltage divider will change the voltage input, $V_{IN(+)}$, to the voltage comparator 62 based on how much capacitance is present at capacitor C1. The resister network made up of resistors R3, R4, R5, and R6 is used to set the voltage of $V_{IN(-)}$. This value should be matched to a threshold voltage needed at $V_{IN(+)}$ to make an open/closed detection at capacitor C1. The voltage comparator 62 will compare the two voltage inputs and the output will be a digital high if $V_{IN(+)}$ is greater than $V_{IN(-)}$. The output will be low if $V_{IN(+)}$ is less than $V_{IN(-)}$. In this scenario an output low would indicate that the slider is closed and an output high would indicate that the slider is open. Capacitor C2 is used to help keep a stable voltage reference for the voltage comparator 62.

Figure 7:
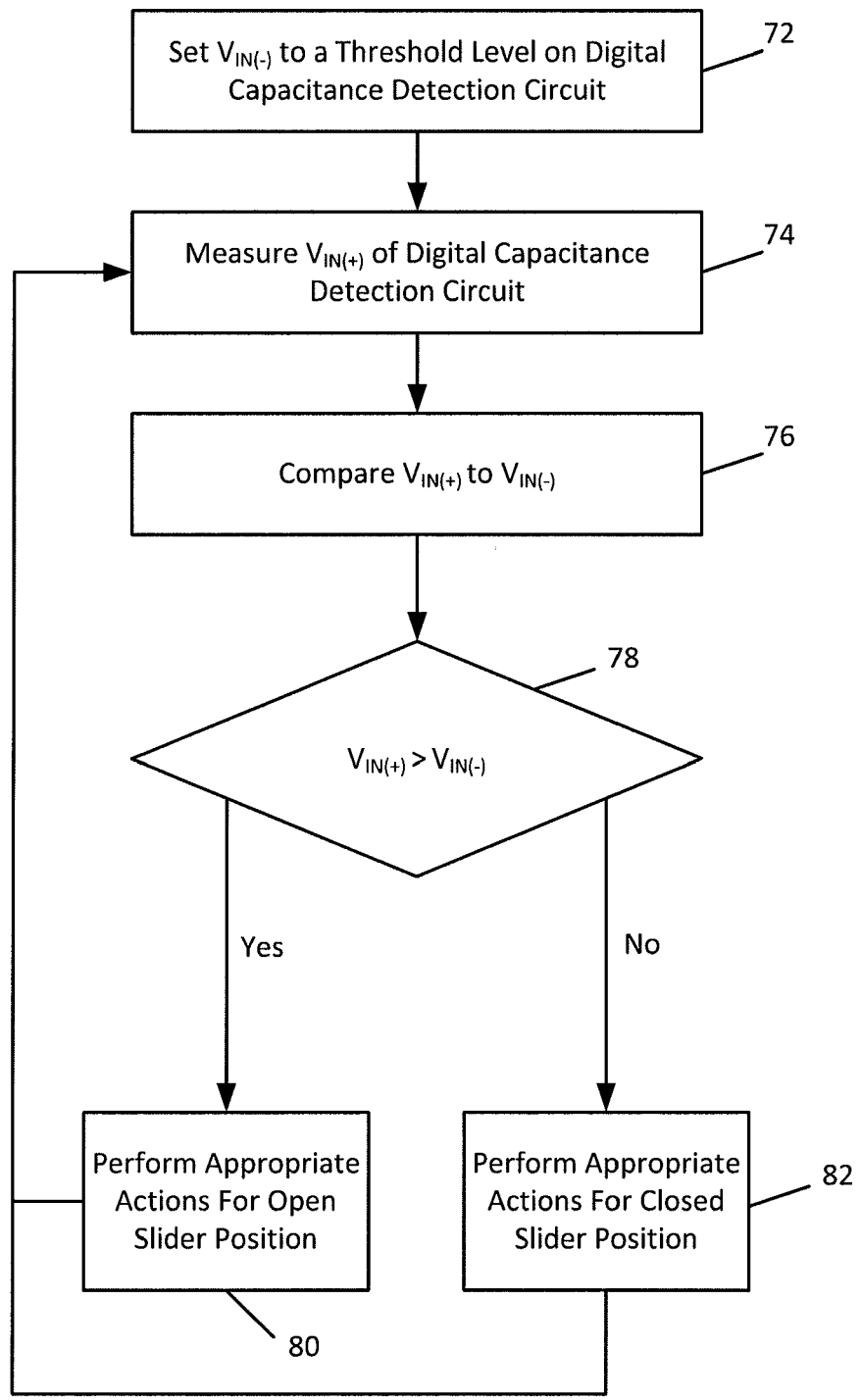
FIG. 7 is a logic diagram for the steps involved in determining the position of a slider type mobile device utilizing the digital output circuit.

FIG. 7 is a logic diagram for the steps involved in determining the position of a slider type mobile device utilizing the digital output circuit of FIG. 6. A threshold voltage level is set for $V_{IN(-)}$ 72. The threshold value is chosen such that the voltage present at $V_{IN(+)}$ will change from greater than $V_{IN(-)}$ when the slider is closed to less than $V_{IN(-)}$ when the slider is open. The voltage $V_{IN(+)}$ is then determined 74 and compared to $V_{IN(-)}$ 76. If $V_{IN(+)} > V_{IN(-)}$ 78 then the capacitance sensing application will perform the appropriate actions associated with an open slider position 80. Otherwise, if $V_{IN(+)} < V_{IN(-)}$ 78 then the capacitance sensing application will perform the appropriate actions associated with an closed slider position 82. As previously discussed, the appropriate actions can vary and depend on the functions associated with the slider mechanism. Those of ordinary skill in the art can readily use the circuit detection results as input to virtually any other feature or application associated with the mobile phone device in this example.

Figure 8:
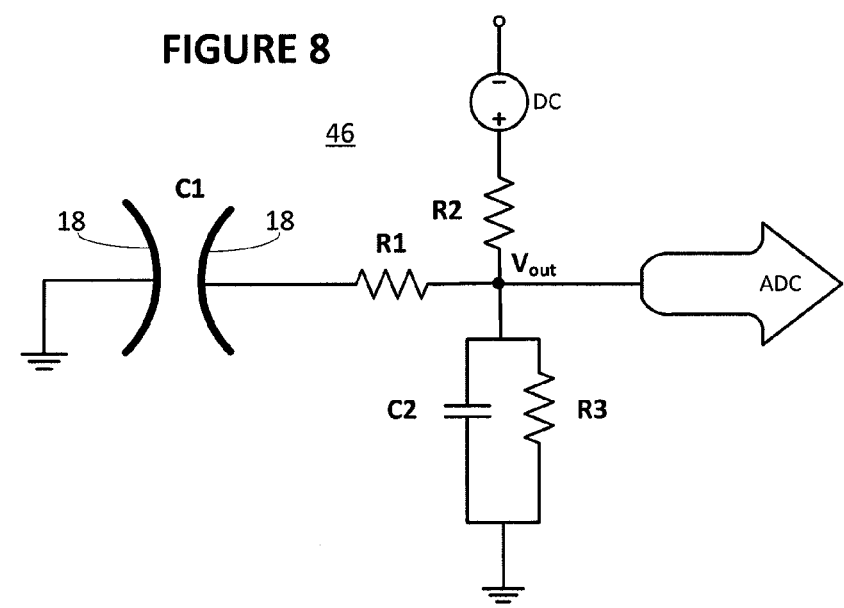
FIG. 8 illustrates an analog output circuit to aid in detecting the position of the slider type mobile device.

FIG. 8 illustrates an analog output circuit to aid in detecting the position of the slider type mobile device. Using an analog detection circuit and method allows the capacitance sensing application to determine to what extent the slider is open.

Again, the metallic strip capacitive sensing plates 18 comprise capacitor C1 and can be found on the top 24 and bottom 22 plates of the mobile phone device 10. The capacitance at capacitor C1 will change the voltage levels between resistor R1 and resistor R2. The voltage change is a direct linear relationship to the capacitance changes at capacitor C1. An analog-to-digital converter (ADC) will read this voltage level and determine how much capacitance is present at capacitor C1. This value will give an indication how much overlap is present between the two parallel capacitance sensing strips 18. Capacitor C2 and resistor R3 are only used to keep a stable reference voltage at the input to the ADC.

The degree of overlap between the strips 18 indicates where the top 24, 26 and bottom 22 plates of the mobile phone device 10 are in relation to each other. This could be useful for an application that needs to know more than just whether the slider is in an open or closed position. For example, there could be an application that is triggered when the slider stays half open.

Figure 9:
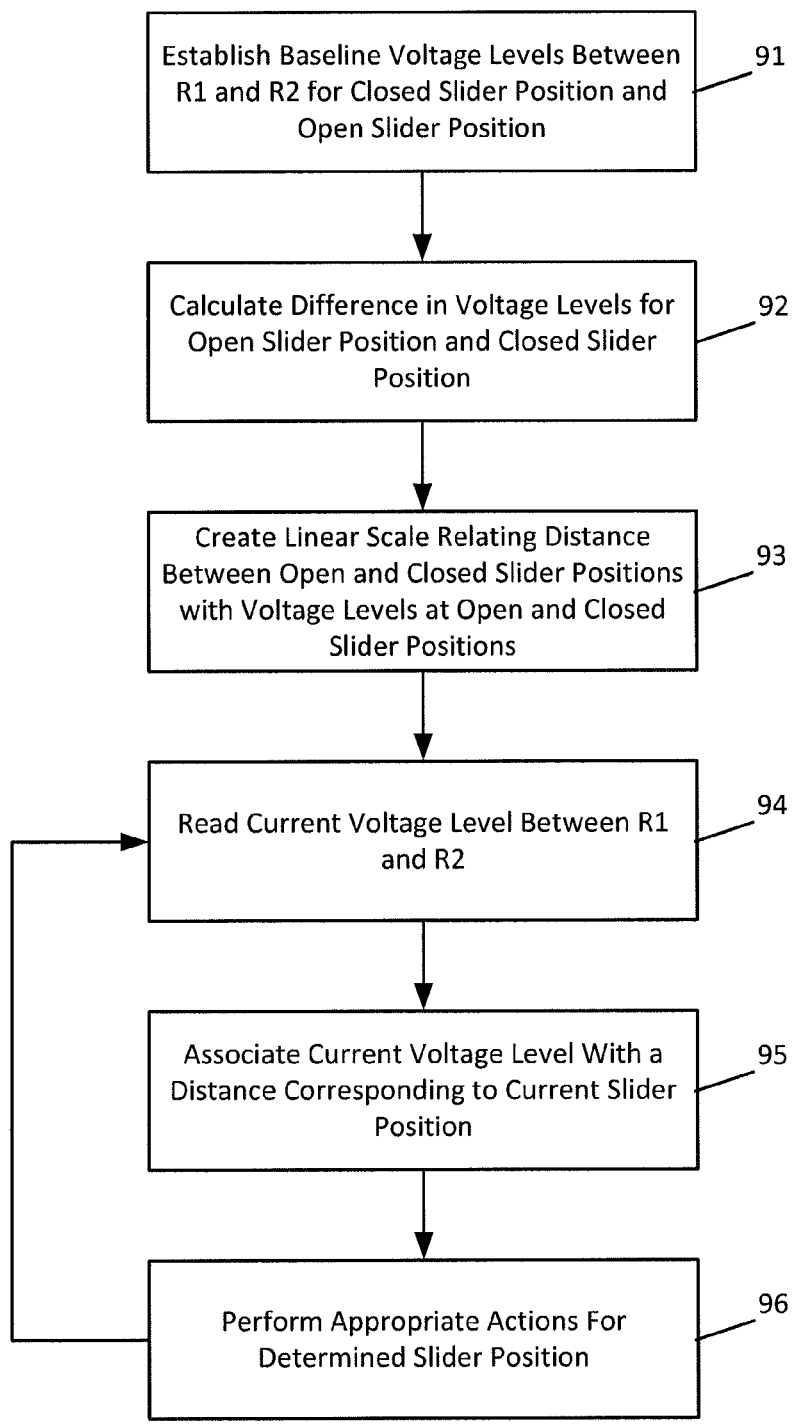
FIG. 9 is a logic diagram for the steps involved in determining the position of a slider type mobile device utilizing the analog output circuit.

FIG. 9 is a logic diagram for the steps involved in determining the position of a slider type mobile device utilizing the analog output circuit. The principles outlined above relating to a digital circuit can also be applied to an analog circuit. The analog circuit affords the additional benefit of being able to determine the degree of openness of the slider. A baseline voltage present between R1 and R2 of FIG. 8 is established for both the open slider position and a closed slider position 91. That is, the voltage present between R1 and R2 is measured when the capacitive sensing strips completely overlap one another (closed position) and also when the capacitive sensing strips are completely separated from one another (open position). The voltage will change based on the change in capacitance present in C1. The difference in the voltage levels is then calculated for the open and closed positions 92. A linear scale that relates the voltage levels at any given time to the degree of overlap of the capacitive sensing strips is created 93. The degree of overlap is then associated with a distance that the slider mechanism has been moved.

When the slider is shifted away from the closed position (completely overlapping) to a new position, such as, for instance, half way overlapping, the voltage present between R1 and R2 will vary linearly with the change in capacitance. Since the capacitance of C1 changes linearly with the overlapping surface area of the capacitive sensing strips, the degree of openness of the slider can calculated 95 upon determining the current voltage level between R1 and R2 94. The appropriate actions based on the degree of openness can then be performed by the mobile phone device 96.

As will be appreciated by one of skill in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Any prompts associated with the present invention may be presented and responded to via a graphical user interface (GUI) presented on the display of the mobile communications device or the like. Prompts may also be audible, vibrating, etc.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A circuit for determining whether a slider-type mobile device is in an open position or a closed position, the circuit comprising:
 a first capacitor, including a first capacitive sensing strip and a second capacitive sensing strip, where the first capacitive sensing strip is positioned on a first sliding portion of the slider-type mobile device and the second capacitive sensing strip is positioned on a second sliding portion of the slider-type mobile device, such that in a closed position, the first capacitive sensing strip and the second capacitive sensing strip overlap one another and in an open position, the first capacitive sensing strip and the second capacitive sensing strip have no overlap with one another;
 a voltage divider, including a first resistor network coupled with the first capacitor to generate a voltage $V_{IN(+)}$;
 a voltage comparator, having a first input and a second input, where the first input receives the voltage $V_{IN(+)}$ from the voltage divider;
 a second resistor network to generate and provide a voltage $V_{IN(-)}$ to the second input of the voltage comparator input, where the voltage comparator is to generate a digital high condition indicating that the slider-type mobile device is in the open position, when the voltage $V_{IN(+)}$ is greater than the voltage $V_{IN(-)}$ or a digital low condition indicating that the slider-type mobile device is in the closed position when the voltage $V_{IN(+)}$ is less than the voltage $V_{IN(-)}$; and
 a processor to receive the generated output from the voltage comparator and control an operation of the slider-type mobile device based on the received generated output.

2. The circuit of claim 1, further comprising a second capacitor coupled with the second resistor network to maintain the stability of the voltage $V_{IN(-)}$.

3. The circuit of claim 1, where the generated output is an input signal to an application associated with the slider-type mobile device.

4. A method of determining whether a slider-type mobile device, including a slider having a first sliding portion and second sliding portion, is in an open position or a closed position using a capacitor circuit including a first capacitor, having a first capacitive sensing strip and a second capacitive sensing strip, where the first capacitive sensing strip is positioned on the first sliding portion and the second capacitive sensing strip is positioned on the second sliding portion, such that in a closed position, the first capacitive sensing strip and the second capacitive sensing strip overlap one another and in an open position, the first capacitive sensing strip and the second capacitive sensing strip have no overlap with one another; a voltage divider, including a first resistor network coupled with the first capacitor to generate a voltage $V_{IN(+)}$; a voltage comparator, having a first input and a second input, where the first input receives the voltage $V_{IN(+)}$ from the voltage divider; a second resistor network to generate and provide a voltage $V_{IN(-)}$ to the second input of the voltage comparator, where the voltage comparator is to generate a digital high condition indicating that the slider is in the open position, when $V_{IN(+)}$ is greater than the voltage $V_{IN(-)}$ or a digital low condition indicating that the slider is in the closed position when the voltage $V_{IN(+)}$ is less than the voltage $V_{IN(-)}$, the method comprising:
 setting the voltage $V_{IN(-)}$ to a threshold level;
 measuring the voltage $V_{IN(+)}$;
 comparing the voltage $V_{IN(+)}$ to the voltage $V_{IN(-)}$;
 determining, by a processor, that the slider is in an open position if the voltage $V_{IN(+)}$ is greater than the voltage $V_{IN(-)}$ or that the slider is in a closed position if the voltage $V_{IN(+)}$ is less than the voltage $V_{IN(-)}$; and
 controlling an operation of the slider-type mobile device based on a position of the slider.

5. The method of claim 4, where controlling the operation of the slider-type mobile device includes providing a signal to an application associated with the slider-type mobile device based on a position of the slider.

* * * * *